(12) United States Patent
Kushida et al.

(10) Patent No.: US 7,187,616 B2
(45) Date of Patent: Mar. 6, 2007

(54) MOS SEMICONDUCTOR INTEGRATED CIRCUIT DEVICE

(75) Inventors: Keiichi Kushida, Yokohama (JP); Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 11/213,877

(22) Filed: Aug. 30, 2005

(65) Prior Publication Data
US 2006/0133177 A1 Jun. 22, 2006

(30) Foreign Application Priority Data
Dec. 22, 2004 (JP) ............................. 2004-371904

(51) Int. Cl.
*G11C 8/00* (2006.01)
(52) U.S. Cl. .............................. 365/230.06; 365/230.08
(58) Field of Classification Search ........... 365/230.06, 365/230.08, 154
See application file for complete search history.

(56) References Cited

U.S. PATENT DOCUMENTS 5,602,796 A * 2/1997 Sugio ..................... 365/230.06
5,886,942 A * 3/1999 Akita ..................... 365/230.06
5,912,857 A * 6/1999 Kim et al. .............. 365/230.06
6,665,229 B2 * 12/2003 Lee et al. ............... 365/230.06

OTHER PUBLICATIONS

Masanao Yamaoka, et al., "A 300MHz 25 µA/Mb Leakage On-Chip SRAM Module Featuring Process-Variation Immunity and Low-Leakage-Active Mode for Mobile-Phone Application Processor", 2004 IEEE International Solid-State Circuits Conference / Session 27 / SRAM / 27.2, Digest of Technical Papers, Salon 10-15, Feb. 18, 2004, pp. 494-495.
Koji Nii, et al., "A 90 nm Low Power 32K-Byte Embedded SRAM with Gate Leakage Suppression Circuit for Mobile Applications", 2003 Symposium on VLSI Circuits Digest of Technical Papers, 2003, pp. 247-250.

* cited by examiner

*Primary Examiner*—Anh Phung
(74) *Attorney, Agent, or Firm*—Oblon, Spivak, McClelland, Maier & Neustadt, P.C.

(57) ABSTRACT

A first P-channel transistor is connected between a gate of an N-channel transistor constituting a last-stage buffer circuit and an output of a prebuffer circuit. A second P-channel transistor is connected between the power supply node and a gate of a P-channel transistor constituting a last-stage buffer circuit. A first N-channel transistor is connected between an N-channel transistor constituting the prebuffer circuit and the ground potential supply node. A second N-channel transistor is connected between the power supply node and a P-channel transistor constituting the main buffer circuit.

16 Claims, 4 Drawing Sheets

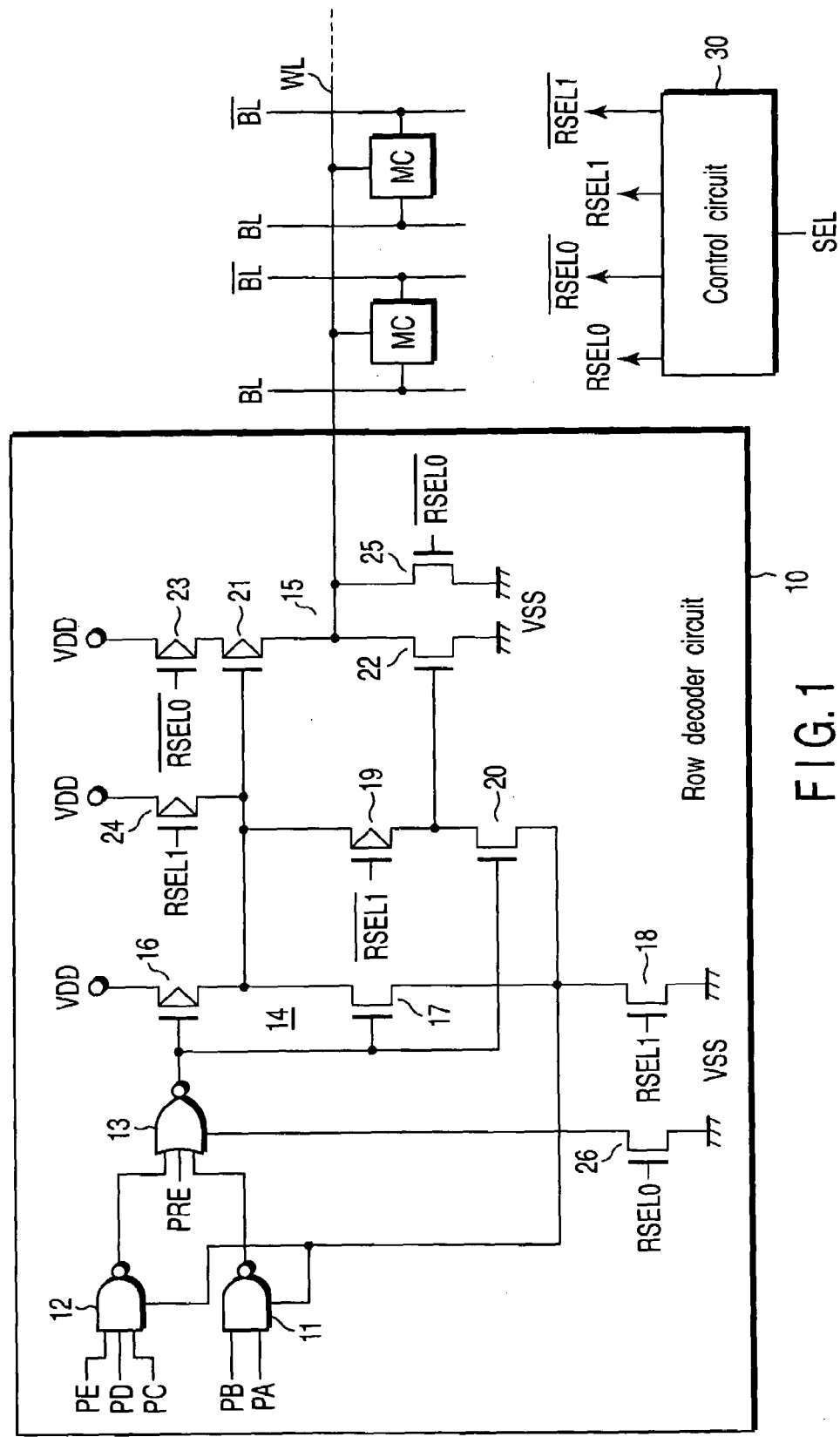
F I G. 1

MOS SEMICONDUCTOR INTEGRATED CIRCUIT DEVICE

CROSS-REFERENCE TO RELATED APPLICATIONS

This application is based upon and claims the benefit of priority from prior Japanese Patent Application No. 2004-371904, filed Dec. 22, 2004, the entire contents of which are incorporated herein by reference.

BACKGROUND OF THE INVENTION

1. Field of the Invention

The present invention relates to a MOS semiconductor integrated circuit device adapted to realize low power dissipation by interrupting the power to a circuit at standby time.

2. Description of the Related Art

In the recent semiconductor trade, as the market of portable electronic equipment has expanded, the demand has increased for developing MOS semiconductor integrated circuit devices adapted to effect a reduction in power dissipation. Above all, static random access memories (SRAMs) have become larger and larger every year in their area on LSI chips. From the point of view of power dissipation, therefore, the importance of lowering the supply voltage of the SRAMs has increased. The row decoder circuit in peripheral circuits of the SRAM macro accounts for most of the leakage current which determines standby power dissipation of an LSI chip containing an SRAM macro.

The row decoder circuit includes a prebuffer circuit and the last-stage main buffer circuit. A word line is selectively driven by an output signal of the main buffer circuit.

In general, in the row decoder circuit, the word lines are fixed at a low level in potential at standby time, thereby preventing the word lines from shifting from the low level due to the effect of noise or the like.

At standby time, various leakage currents are generated in the row decoder circuit. In general, P- and N-channel MOS transistors that constitute the main buffer circuit are large in device size. For this reason, subthreshold leakage and gate leakage in the main buffer circuit form the main leakage current sources at standby time, to which subthreshold leakage in the prebuffer circuit is added. Thus, making provisions for such leakage currents allows the leakage current in the row decoder circuit to be reduced.

As for provisions for leakage in the row decoder circuit, some research has already been carried out in various institutions. The important point regarding the provisions for leakage in the row decoder circuit is that the word lines must be fixed at 0 volts at standby time as described previously. Noise on the word lines might cause memory cells to be selected in error, leading to data destruction. Therefore, the word lines must be fixed at 0 volts at standby time including mode transition time.

A conventional row decoder circuit intended to reduce the standby leakage current is one which is described in document 1 ("A 300 MHz 25 uAMb Leakage On-Chip SRAM Module Featuring Process-Variation Immunity and Low-Leakage-Active Model for Mobile-Phone Application Processor", M. Yamaoka, ISSCC 2004). In the row decoder circuit described in document 1, current-cutoff N-channel MOS transistors are inserted in the middle of current paths on the ground potential side in circuits other than the last-stage buffer circuit to thereby interrupt the power. In the last-stage buffer circuit, the word lines must be fixed at 0 volts at standby time. For this reason, it is impossible to insert a current-cutoff N-channel MOS transistor in the middle of the current path on the ground potential side for the purpose of interrupting the power. In the last-stage buffer circuit, therefore, a current-cutoff P-channel MOS transistor is inserted in the middle of the current path on the supply voltage Vdd side to thereby interrupt the power.

In the row decoder circuit described in document 1, however, the gate-to-source voltage Vgs of the N-channel MOS transistor in the last-stage buffer circuit become VDD (supply voltage) at standby time; thus, the gate leakage current of the N-channel MOS transistor cannot be reduced. This will particularly become a problem when the effect of gate leakage increases in the next-generation MOS semiconductor integrated circuit devices.

Another conventional row decoder circuit intended to reduce the standby leakage current is one which is described in document 2 (A 90 nm Low Power 32 K-Byte Embedded SRAM with Gate Leakage Suppression Circuit for Mobile Application", Koji Nii et al., 2003 Symposium on VLSI Circuits Digest of Technical Papers, pp. 247–250 (FIG. 7b)). In the row decoder circuit described in document 2, the last-stage buffer circuit is composed of a P-channel MOS transistor and an N-channel MOS transistors. A transfer gate is added between the gate of the N-channel MOS transistor and the output node of the prebuffer circuit preceding the last-stage buffer circuit. When the word line is on standby, the transfer gate is turned off by a signal on the word line, causing the gate of the N-channel MOS transistor to go into the floating state. In the floating state, the gate voltage of the N-channel MOS transistor drops gradually due to the gate leakage. Thereby, the gate-to-source voltage Vgs of the N-channel MOS transistor drops, suppressing the generation of gate leakage current.

In the row decoder circuit described in document 2, however, subthreshold leakage current flows in the P-channel MOS transistor in the last-stage buffer circuit. Since the transistors in the last-stage buffer circuit are large in device size as described previously, a large subthreshold current flows in the standby state.

Thus, in the conventional MOS semiconductor integrated circuit devices intended to reduce power dissipation, both the gate leakage current and the subthreshold leakage current cannot be reduced and hence a sufficient leakage current reducing effect cannot be attained.

BRIEF SUMMARY OF THE INVENTION

According to one aspect of the invention, there is provided a MOS semiconductor integrated circuit device comprising: a prebuffer circuit connected to receive a signal produced within the semiconductor integrated circuit device and including a first transistor of P-channel type and a second transistor of N-channel type each having a gate and a current path, the first and second transistors being connected at their gates to receive the signal, one end of the current paths of the first and second transistors being connected together to the output node of the prebuffer circuit, and the other end of the current path of the first transistor being connected to a first power supply node; a third transistor of N-channel type having a gate and a current path connected at its one end to the other end of the current path of the second transistor and at its other end to a second power supply node; a fourth transistor of P-channel type having a gate and a current path connected at its one end to the output node of the prebuffer circuit; a fifth transistor of N-channel type having a gate connected to receive the signal and a current path connected between the other end of the current path of the fourth transistor and one end of the current path of the third transistor; the last-stage buffer circuit connected to the output node of the prebuffer circuit and including a sixth transistor of P-channel type having a gate and a current path one end of which is connected to the output node of the last-stage buffer circuit and a seventh transistor of N-channel type having a gate and a current path connected between the output node of the last-stage buffer circuit and the second power supply node, the gate of the sixth transistor being connected to the output node of the prebuffer circuit and the gate of the seventh transistor being connected to the other end of the current path of the fourth transistor; an eighth transistor of P-channel type having a gate and a current path connected between the other end of the current path of the sixth transistor and the first power supply node; a ninth transistor of P-channel type having a gate and a current path connected between the first power supply node and the output node of the prebuffer circuit; and a control circuit which produces a plurality of control signals applied to the gates of the third, fourth, eighth and ninth transistors, in a standby state, the third, fourth and eighth transistors are turned off and the ninth transistor is turned on and, in an active state, the third, fourth and eighth transistors are turned on and the ninth transistor is turned off.

BRIEF DESCRIPTION OF THE SEVERAL VIEWS OF THE DRAWING

FIG. 1 shows the circuit arrangement of a static random access memory according to a first embodiment of the present invention;

DETAILED DESCRIPTION OF THE INVENTION

Figure 2:
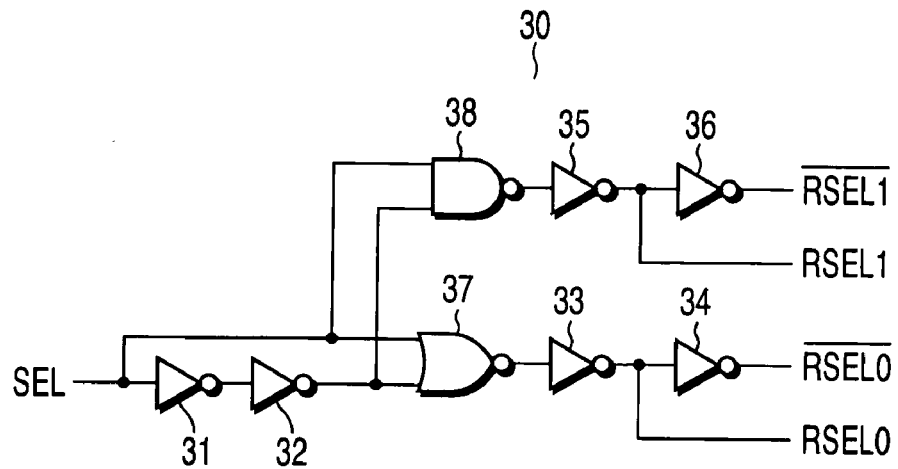
FIG. 2 shows an exemplary circuit arrangement of the control circuit shown in FIG. 1.

The embodiments of the present invention will be described hereinafter with reference to the accompanying drawings.

First Embodiment

FIG. 1 shows the circuit arrangement of a static random access memory (SRAM) according to a first embodiment of the present invention. Reference numeral 10 denotes a word line drive circuit (hereinafter referred to as the row decoder circuit). To the row decoder circuit 10 is connected a word line WL to which a plurality of memory cells MC each consisting of a static cell is connected. To each memory cell is connected a pair of bit lines BL and /BL over which data read from a selected memory cell or data to be written into a selected memory cell is transferred.

The row decoder circuit 10 decodes an internal address signal to drive the word line WL. The row decoder circuit 10 includes a NAND gate circuit 11 which decodes internal address signals PA and PB, a NAND gate circuit 12 which decodes internal address signals PC, PD, and PE, a NOR gate circuit 13 connected to receive output signals of the NAND gate circuits 11 and 12 and a precharge control signal PRE, a prebuffer circuit 14 connected to receive an output signal of the NOR gate circuit 13, and a main buffer circuit 15 which is connected to receive an output signal of the prebuffer circuit 14 and forms the last stage of the row decoder circuit 10.

The prebuffer circuit 14 includes a P-channel MOS transistor 16 and an N-channel MOS transistor 17 which have their gates connected together to receive the output signal of the NOR gate circuit 13. Each of the transistors 16 and 17 has one end of its current path between source and drain connected to the output node of the prebuffer circuit 14. The other end of the current path of the transistor 16 is connected to a first power supply node supplied with a supply voltage VDD of positive polarity. The other end of the current path of the transistor 17 is connected to one end of the between-source-and-drain current path (hereinafter referred to simply as the current path) of an N-channel MOS transistor 18. The other end of the current path of the transistor 18 is connected to a second power supply node supplied with ground potential VSS of 0V. The transistor 18 is connected at its gate to receive a control signal RSEL1.

To the output node of the prebuffer circuit 14 is connected one end of the current path of a P-channel transistor 19, which is connected at its gate to receive a signal /RSEL1 which is the inverse of the control signal RSEL1. Between the other end of the current path of the transistor 19 and one end of the current path of the transistor 18 is connected the current path of an N-channel MOS transistor 20, which is connected at its gate to the common gates of the transistors 16 and 17.

The main buffer circuit 15 includes a P-channel MOS transistor 21 and an N-channel MOS transistor 22 each of which is connected at one end of its current path to the output node of the main buffer circuit 15. The output node of the main buffer circuit 15 is connected to the word line WL. The gate of the transistor 21 is connected to the output node of the prebuffer circuit 14. The gate of the transistor 22 is connected to the other end of the current path of the transistor 19. Between the other end of the current path of the transistor 21 and the first power supply node is inserted the current path of a P-channel MOS transistor 23, which is connected at its gate to receive a control signal /RSEL0. Between the first power supply node and the output node of the prebuffer circuit 14 is inserted the current path of a P-channel MOS transistor 24, which is connected at its gate to receive the control signal RSEL1. Between the output node of the main buffer circuit 15 and the second power supply node is connected the current path of an N-channel MOS transistor 25, which is connected at its gate to receive the control signal /RSEL0.

Each of the NAND gate circuits 11 and 12 and the NOR gate circuit 13 is a CMOS circuit comprised of P- and N-channel MOS transistors. The sources of the N-channel MOS transistors which are the power supply nodes on the N-channel MOS transistor side in the NAND gate circuits 11 and 12 are connected in common to one end of the current path of the transistor 18. The source on the N-channel MOS transistor side in the NOR gate circuit 13 is connected to one end of the current path of an N-channel transistor 26. The other end of the current path of the transistor 26 is connected to the second power supply node. The gate of the transistor 26 is connected to receive a control signal RSEL0. The sources of the P-channel MOS transistors on the power supply node side in the NAND gate circuits 11 and 12 and the NOR gate circuit 13 are supplied with the supply voltage VDD.

In the main buffer circuit 15 adapted to drive the word line WL via its output signal, a larger current flows than in the prebuffer circuit 14. In order to allow a larger current to flow in the main buffer circuit 15 than in the prebuffer circuit 14, at least the P-channel MOS transistor 21 of the P- and N-channel MOS transistors in the main buffer circuit 14 is made larger in device size than the P-channel MOS transistor 16 in the prebuffer circuit 14. Naturally, the N-channel MOS transistor 22 in the main buffer circuit 15 may also be made larger in size than the transistor 17 in the prebuffer circuit 14.

A control circuit 30, which is adapted to produce the control signals RSEL0, /RSEL0, RSEL1, and /RSEL1 according to a select signal SEL, has such a circuit arrangement as shown in FIG. 2. That is, the control circuit 30 includes six inverter circuits 31 to 36, a two-input NAND gate circuit 37, and a two-input NOR gate circuit 38.

The select signal SEL is applied to one input of each of the NOR gate circuit 37 and the NAND gate circuit 38. The select signal SEL is also applied through the cascade-connected inverter circuits 31 and 32 to the other input of each of the NOR gate circuit 37 and the NAND gate circuit 38. The output signal of the NOR gate circuit 37 is applied to the inverter circuit 33, which outputs the control signal RSEL0. The output signal of the inverter circuit 33 is then applied to the inverter circuit 34, which outputs the control signal /RSEL0. The output signal of the NAND gate circuit 38 is applied to the inverter circuit 35, which outputs the control signal RSEL1. The output signal of the inverter circuit 35 is then applied to the inverter circuit 36, which outputs the control signal /RSEL1.

The operation of the SRAM arranged as described above will be described with reference to a timing diagram shown in FIG. 3. The SRAM shown in FIG. 1 is a clock-locked type which operates synchronously with a clock signal CLK.

Figure 3:
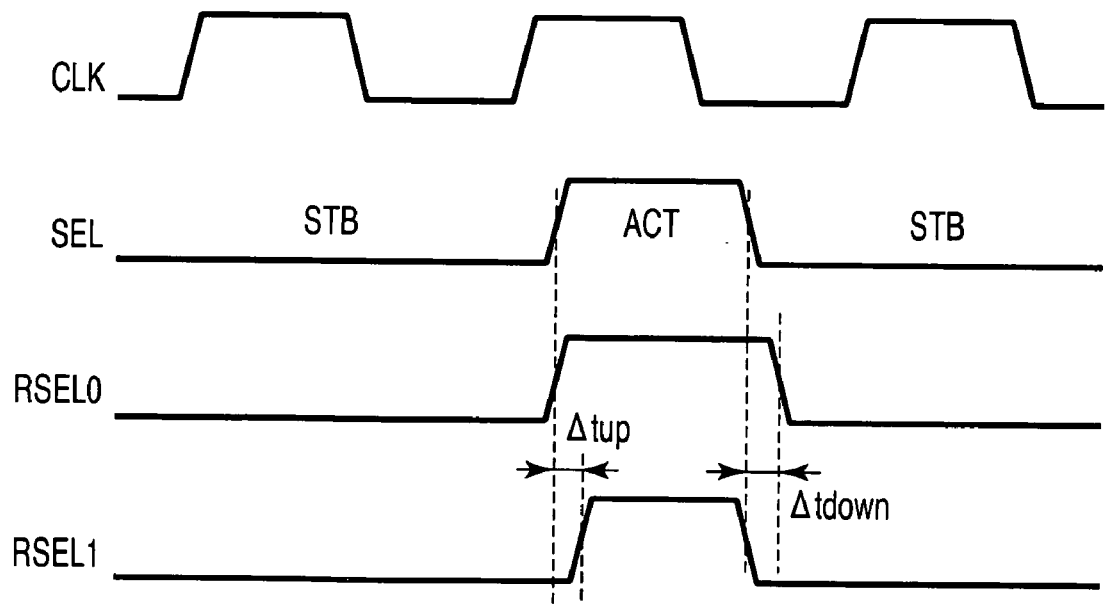
FIG. 3 is an exemplary timing diagram illustrating the operation of the static random access memory shown in FIG. 1.

The select signal SEL is caused to go to a high level at active time (during the interval labeled "ACT" in FIG. 3). When the select signal SEL goes high, the output signal of the inverter circuit 32 in the control circuit 30 goes high, causing both the output signals of the NOR and NAND gate circuits 37 and 38 to go low. Thus, the control signal RSEL0, which is the output signal of the inverter circuit 33, goes high and the control signal /RSEL0, which is the output signal of the inverter circuit 34, goes low. The control signal RSEL1, which is the output signal of the inverter circuit 35, goes high and the control signal /RSEL1, which is the output signal of the inverter circuit 36, goes low.

At this point, in the row decoder 10, the transistors 18, 19, 23 and 26 go into the conductive state, while the transistors 24 and 25 go into the nonconductive state. At this point, the precharge control signal PRE is at a low level. When the transistors 18 and 26 are in the conductive state, the NAND gate circuits 11 and 12 and the NOR gate circuit 13 are each supplied with ground potential VSS and hence placed in the operating state, allowing a decoded signal corresponding to the internal address signals to be output from the NOR gate circuit 13.

When the transistor 18 is in the conductive state, the prebuffer circuit 14 is also supplied with ground potential VSS. Since the transistor 19 is conductive and the transistor 24 is nonconductive, the prebuffer circuit 14 supplies the output signal of the NOR gate circuit 13 to the gates of the transistors 21 and 22 in the main buffer circuit 15 with inversion.

When the transistor 23 is in the conductive state, on the other hand, the main buffer circuit 15 is supplied with supply voltage VDD. At this point, the transistor 25 connected to the output node of the main buffer circuit 15 is nonconductive. The main buffer circuit 15 thus applies the output signal of the prebuffer circuit 14 to the word line WL with inversion.

That is, at active time, the row decoder circuit 10 decodes the internal address signals to produce a decoded signal, so that the word line WL is selectively driven according to the decoded signal.

At standby time (during the time interval labeled "STB" in FIG. 3), the select signal SEL is set low. When the select signal SEL is low, the output signal of the inverter circuit 32 in the control circuit 30 goes low, causing both the output signals of the NOR and NAND gate circuits 37 and 38 to go high. Thus, the control signal RSEL0, which is the output signal of the inverter circuit 33, goes low and the control signal /RSEL0, which is the output signal of the inverter circuit 34, goes high. The control signal RSEL1, which is the output signal of the inverter circuit 35, goes low and the control signal /RSEL1, which is the output signal of the inverter circuit 36, goes high.

At this point, in the row decoder 10, the transistors 18, 19, 23 and 26 go into the nonconductive state, while the transistors 24 and 25 go into the conductive state. When the transistors 18 and 26 are in the nonconductive state, the NAND gate circuits 11 and 12, and the NOR gate circuit 13 are not supplied with ground potential VSS. At standby time, the precharge control signal PRE is set high so that the word line WL is fixed at 0V. When the precharge control signal PRE is high, there is no fear that the output signals of the NOR gate circuit 13, the prebuffer circuit 14, and the main buffer circuit 15 may make transitions from the low to the high level, from the high to the low level, and from the low to the high level, respectively.

When the transistor 18 is in the nonconductive state, the prebuffer circuit 14 is not supplied with ground potential VSS. Since the transistor 23 is turned off, the main buffer circuit 15 is not supplied with supply voltage VDD. The output node of the prebuffer circuit 14 to which the gate of the transistor 21 is connected is set to the high level by the transistor 24 in the on state, which prevents a subthreshold leakage current from flowing in the transistor 21 in the main buffer circuit 15.

Since the transistor 19 is turned off at standby time, the gate of the transistor 22 in the main buffer circuit 15 is isolated from the output node of the prebuffer circuit 14 and goes into the floating state. Immediately after the transistor 22 has gone into the floating state, its gate voltage starts to drop gradually due to gate leakage. As the result, the gate-to-source voltage Vgs of the transistor 22 gradually changes in the direction of relaxation, thereby reducing its gate leakage current.

At standby time, the word line WL is fixed at VSS of 0V because the transistor 25 is placed in the nonconductive state. This eliminates the possibility of noise being generated on the word line WL, allowing the prevention of malfunction due to noise.

Thus, at standby time, no subthreshold leakage current flows in the P-channel MOS transistor 21 in the main buffer circuit 15 and the gate leakage current of the N-channel MOS transistor 22 is reduced.

At standby time, the potential on the gate of the transistor 16 in the prebuffer circuit 14 is set low, causing a gate leakage current to flow between its source and gate. In addition, a gate leakage current flows between the source and gate of the transistor 25. However, the transistor 16 in the prebuffer circuit 14 is sufficient if it can flow a current enough to drive the main buffer circuit 15 and the transistor 25 is for suppressing noise. Therefore, these transistors 16 and 25 can be made much smaller in device size in comparison with the transistors in the main buffer circuit 15, allowing the values of leakage currents in these transistors to be neglected. In comparison with the prior art, therefore, the standby leakage current can be reduced greatly.

Next, the operation upon return from the standby state to the active state will be described. Upon transition to the active state, the select signal SEL is raised from the low level to the high level. After that, the output signal of the NOR gate circuit 37 in the control circuit 30 immediately goes to the low level, causing the control signals RSEL0 and /RSEL0 to go high and low, respectively. Thereby, in the row decoder circuit 10, the transistors 23 and 26 go into the conductive state and the transistor 25 goes into the nonconductive state.

In the standby state prior to return to the active state, the logic level of the output signal of the NOR gate circuit 13 is merely held by charges stored on the gate of the transistor 16. When, in this state, the prebuffer circuit 14 is supplied with ground potential VSS as the result of the transistor 18 being switched on, a through current might flow in the prebuffer circuit 14. Upon return from the standby state to the active state, therefore, the transistor 26 is first turned on to apply ground potential VSS to the NOR gate circuit 13, thereby establishing the logic level of the output signal of the NOR gate circuit 13.

The transistor 23 is turned on at the same time the transistor 26 is turned on, supplying supply voltage VDD to the main buffer circuit 15. At this point, the transistor 24 still remains conductive to fix the potential on the output node of the prebuffer circuit 14 at the high level. Therefore, no through current will flow in the main buffer circuit 15.

After the lapse of a length of time, Δtup, corresponding to the sum of the signal delay times of the inverter circuits 31 and 32 from transition to the active state, the output signal of the inverter circuit 32 of the control circuit 30 changes from the low to the high level. As the result, the output signal of the NAND circuit 38 changes to the low level, causing the control signals RSEL1 and /RSEL1 to go high and low, respectively. Thereby, in the row decoder circuit 10, the transistors 18 and 19 are rendered conductive and the transistor 24 is rendered nonconductive.

When the transistor 18 is rendered conductive, the NAND gate circuits 11 and 12 and the prebuffer circuit 14 are supplied with ground potential VSS, enabling the NAND gate circuits 11 and 12 to perform a decode operation. When the transistor 19 is rendered conductive, the output signal of the prebuffer circuit 14 is applied to the gate of the transistor 22 in the main buffer circuit 15. At this point, since the level of the output signal of the NOR gate circuit 13 which is applied to the input of the prebuffer circuit 14 has been established, no through current will flow in the prebuffer circuit.

Thus, upon return from the active state to the standby state, no through current will flow in the main buffer circuit 15 and the prebuffer circuit 14.

Upon transition from the active state to the standby state, on the other hand, the select signal SEL is lowered from the high level to the low level. At this point, since the output signal of the inverter circuit 32 is still at the high level, the output signal of the NAND gate circuit 38 goes to the high level, causing the control signals RSEL1 and /RSEL1 to go low and high, respectively. Thereby, in the row decoder circuit 10, the transistor 24 is rendered conductive and the transistors 18 and 19 are rendered nonconductive. This interrupts the ground potential VSS supplied to the prebuffer circuit 14 and the NAND gate circuits 11 and 12 with the result that each of these circuits goes into the standby mode. Since the transistor 24 is rendered conductive and the transistor 18 is rendered nonconductive, the gate of the transistor 21 in the main buffer circuit 15 is fixed at VDD and the gate of the transistor 22 is isolated from the output node of the prebuffer circuit 14 and goes into the floating state.

After the lapse of a length of time, Δtdown, corresponding to the sum of the signal delay times of the inverter circuits 31 and 32 from transition to the standby state, the output signal of the inverter circuit 32 of the control circuit 30 changes from the high to the low level. As the result, the output signal of the NOR circuit 37 changes to the high level, causing the control signals RSEL0 and /RSEL0 to go low and high, respectively. Thereby, in the row decoder circuit 10, the transistors 23 and 26 are rendered nonconductive and the transistor 25 is rendered conductive.

When the transistors 23 and 26 are rendered nonconductive, supply voltage VDD supplied to the main buffer circuit 15 and ground potential VSS supplied to the NOR gate circuit 13 are interrupted. When the transistor 25 is rendered conductive, the word line WL is fixed at ground potential VSS, or 0V. At this point, the control signal RSEL1 has been set low in advance, causing the gate of the P-channel MOS transistor 21 in the main buffer circuit 15 to be fixed at the low level. Thus, no through current will flow in the main buffer circuit 15.

Thus, upon transition from the active state to the standby mode or vice versa, no through current will flow in the last-stage main buffer circuit 15 in which the largest current may flow.

As described above, the SRAM of this embodiment can reduce the off leakage current and the gate leakage current at standby time and prevent the occurrence of through current and malfunction.

Figure 4:
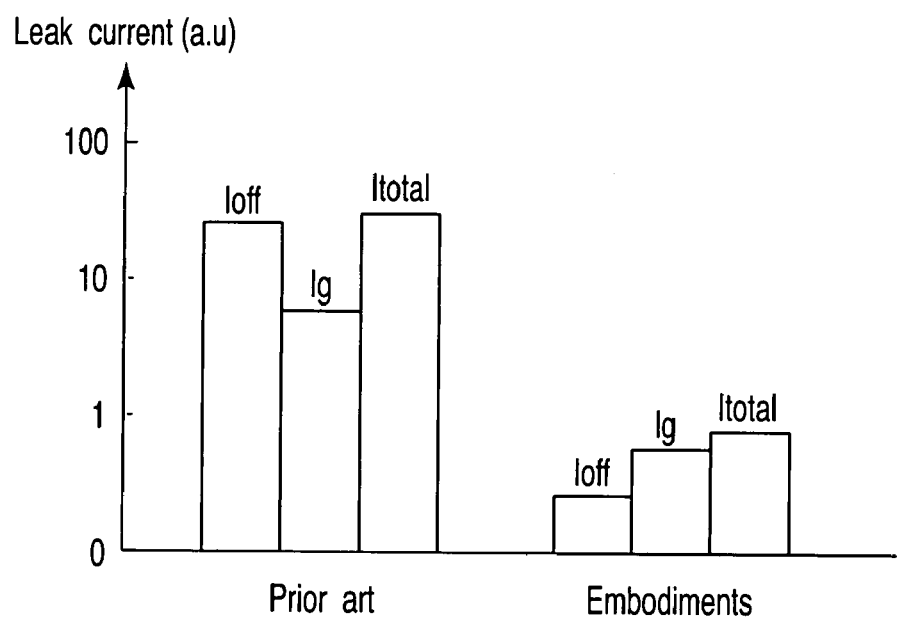
FIG. 4 shows a comparison of leakage currents of the row decoder according to the first embodiment to a prior-art row decoder.

FIG. 4 shows a comparison of the measurements of standby leakage currents between a row decoder circuit (prior art), which is a simple combination of the row decoder circuits described in documents 1 and 2 described previously, and the row decoder circuit in the SRAM of this embodiment. In this figure, Ioff denotes the off leakage current, Ig the gate leakage current, and Itotal the sum of the off and gate leakage currents.

As can be seen from FIG. 4, in the row decoder circuit in the SRAM of this embodiment, the off leakage current Ioff and the gate leakage current Ig are reduced more greatly than in the prior-art row decoder circuit. At the result, the sum of the leakage currents is also reduced greatly. The reason is as follows. That is, if, when the prior art circuits are simply combined, the N-channel transistors corresponding to the transistors 18 and 26 had a sufficient cutoff characteristic, the output signal of the circuit corresponding to the NOR gate circuit 13 two-stage preceding the last-stage main buffer circuit would not completely go to the low level at standby time but would slightly rises from 0V. At this point, the output signal of the circuit corresponding to the prebuffer circuit 14 preceding the main buffer circuit would not completely go to the high level but would fall below voltages that can cause the P-channel MOS transistor in the last-stage circuit to be completely set to the off state.

In contrast, in the row decoder circuit of this embodiment, the gate of the P-channel MOS transistor 21 in the main buffer circuit 15 is completely set to the high level at standby time through the transistor 24; thus, the off leakage current Ioff of the transistor 21 can be reduced greatly.

Second Embodiment

Figure 5:
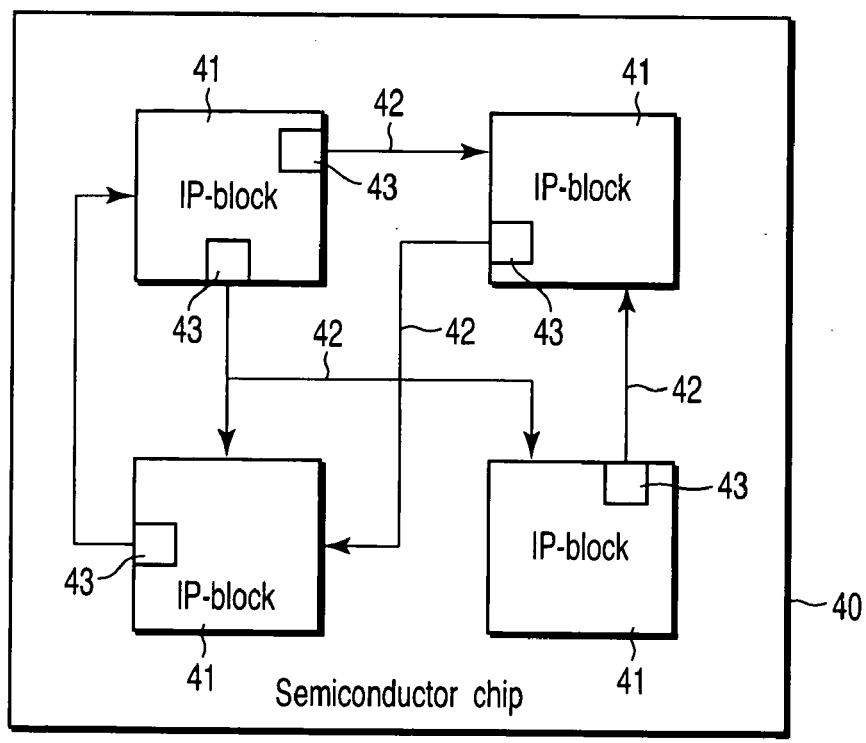
FIG. 5 is a block diagram of a MOS semiconductor integrated circuit device according to a second embodiment of the present invention.

FIG. 5 is a block diagram of a MOS semiconductor integrated circuit device according to a second embodiment of the present invention. In this integrated circuit device, a semiconductor chip 40 is formed with a plurality of intellectual property (IP) blocks 41. The IP block refers to a circuit having a predetermined function. In the example of FIG. 5, four IP blocks are formed in the semiconductor chip 40. In addition, in-chip interconnections 42 which connect the four IP blocks 41 with one another are formed in the semiconductor chip 40. Interconnections over which signals are transferred between the integrated circuit device and outside are omitted from the diagram of FIG. 5.

Each of the four IP blocks 41 is provided with an interface circuit 43 which output signals in the corresponding IP block onto the in-chip interconnections 42 and a control circuit which controls the operation of the interface circuit.

Figure 6:
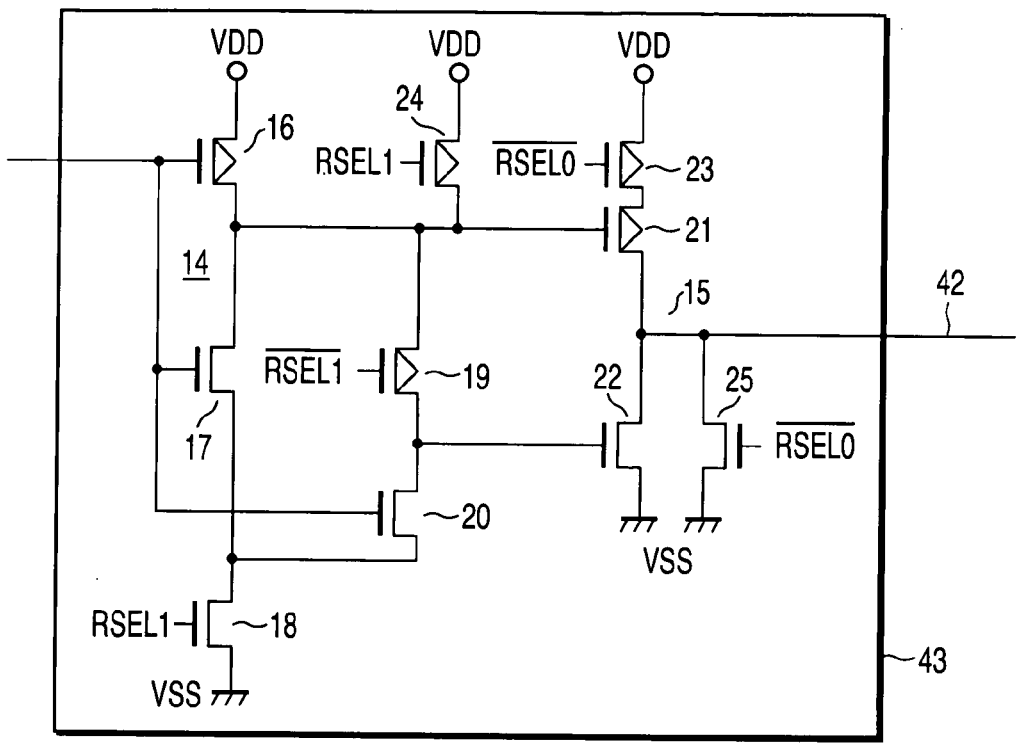
FIG. 6 shows the circuit arrangement of the interface circuit in the semiconductor integrated circuit device shown in FIG. 5.

As shown in FIG. 6, the interface circuit 43 in each of the IP blocks 41 is identical to the circuit of FIG. 1 in the arrangement of the prebuffer circuit 14, the main buffer circuit 15, the N-channel MOS transistors 18, 20 and 25, and the P-channel MOS transistors 19, 23 and 24. However, the P-channel MOS transistor 16 and the N-channel MOS transistor 17 in the prebuffer circuit 14 and the N-channel MOS transistor 20 are connected at their gates to receive a signal to drive the in-chip interconnection 42.

The control circuit in each IP block has the same circuit arrangement as the one shown in FIG. 2.

The operation of each of the interface circuits 43 in the MOS semiconductor integrated circuit device is substantially the same as the operation of the counterpart in FIG. 1; therefore, the description thereof is omitted. The second embodiment can therefore offer the same advantages as the first embodiment shown in FIG. 1.

Third Embodiment

Figure 7:
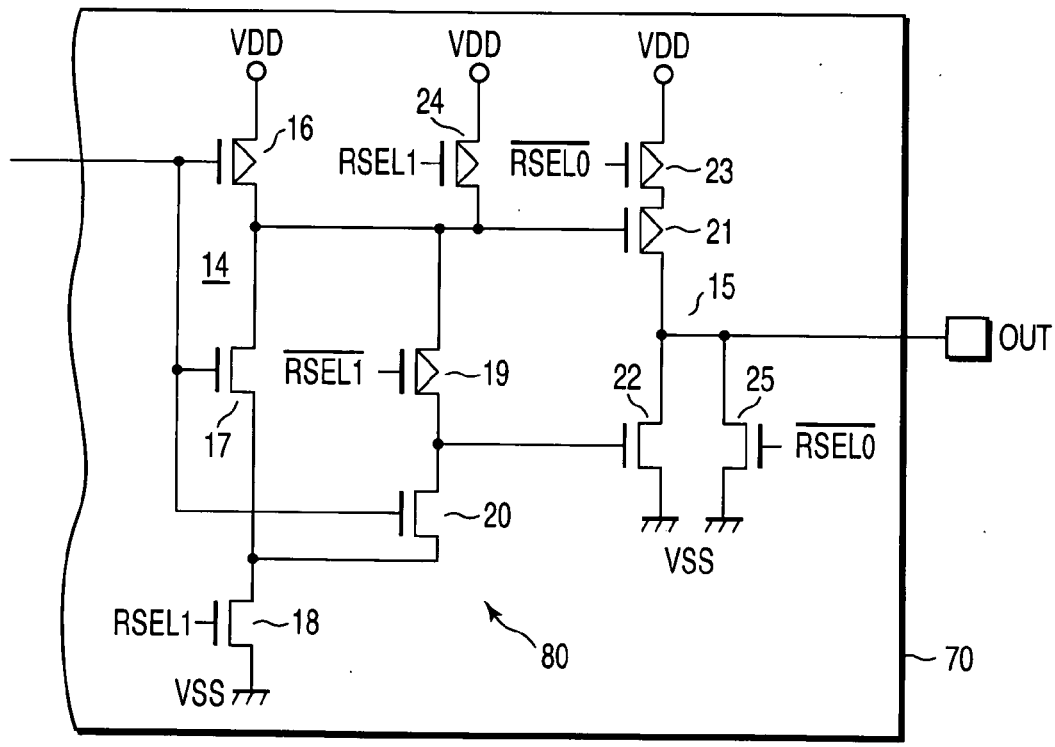
FIG. 7 shows the circuit arrangement of a MOS semiconductor integrated circuit device according to a third embodiment of the present invention.

FIG. 7 shows the circuit arrangement of a MOS semiconductor integrated circuit device according to a third embodiment of the present invention. In this integrated circuit device, a semiconductor chip 70 is formed with an interface circuit 80 and a control circuit which controls the operation of the interface circuit.

The interface circuit 80 is adapted to output signals produced within the semiconductor chip 70 to outside of the chip, and is identical to the circuit of FIG. 1 in the arrangement of the prebuffer circuit 14, the main buffer circuit 15, the N-channel MOS transistors 18, 20 and 25, and the P-channel MOS transistors 19, 23 and 24. However, the P-channel MOS transistor 16 and the N-channel MOS transistor 17 in the prebuffer circuit 14 and the N-channel MOS transistor 20 are connected at their gates to receive a signal within the semiconductor chip. The output node of the main buffer circuit 15 is connected to the output terminal OUT of the chip.

The control circuit formed in the semiconductor chip 70 has the same circuit arrangement as the one shown in FIG. 2.

The operation of the interface circuit 80 in the MOS semiconductor integrated circuit device is substantially the same as the operation of the counterpart in FIG. 1; therefore, the description thereof is omitted. The third embodiment can therefore offer the same advantages as the first embodiment shown in FIG. 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MOS semiconductor integrated circuit device comprising:
a prebuffer circuit connected to receive a signal produced within the semiconductor integrated circuit device and including a first transistor of P-channel type and a second transistor of N-channel type each having a gate and a current path, the first and second transistors being connected at their gates to receive the signal, one end of the current paths of the first and second transistors being connected together to the output node of the prebuffer circuit, and the other end of the current path of the first transistor being connected to a first power supply node;
a third transistor of N-channel type having a gate and a current path connected at its one end to the other end of the current path of the second transistor and at its other end to a second power supply node;
a fourth transistor of P-channel type having a gate and a current path connected at its one end to the output node of the prebuffer circuit;
a fifth transistor of N-channel type having a gate connected to receive the signal and a current path connected between the other end of the current path of the fourth transistor and one end of the current path of the third transistor;
a last-stage buffer circuit connected to the output node of the prebuffer circuit and including a sixth transistor of P-channel type having a gate and a current path one end of which is connected to the output node of the last-stage buffer circuit and a seventh transistor of N-channel type having a gate and a current path connected between the output node of the last-stage buffer circuit and the second power supply node, the gate of the sixth transistor being connected to the output node of the prebuffer circuit and the gate of the seventh transistor being connected to the other end of the current path of the fourth transistor;
an eighth transistor of P-channel type having a gate and a current path connected between the other end of the current path of the sixth transistor and the first power supply node;
a ninth transistor of P-channel type having a gate and a current path connected between the first power supply node and the output node of the prebuffer circuit; and
a control circuit which produces a plurality of control signals applied to the gates of the third, fourth, eighth and ninth transistors, in a standby state, the third, fourth and eighth transistors are turned off and the ninth transistor is turned on and, in an active state, the third, fourth and eighth transistors are turned on and the ninth transistor is turned off.

2. The MOS semiconductor integrated circuit device according to claim 1, further comprising a tenth transistor of N-channel type having a gate and a current path connected between the output node of the last-stage buffer circuit and the second power supply node, and wherein the control circuit produces a control signal applied to the gate of the tenth transistor, in the standby state, the tenth transistor is turned on and, in the active state, it is turned off.

3. The MOS semiconductor integrated circuit device according to claim 1, wherein the control circuit produces the control signals, at the transition from the standby state to the active state, the third transistor is turned on after the eighth transistor has been turned on.

4. The MOS semiconductor integrated circuit device according to claim 1, wherein the control circuit produces the control signals, at the transition from the active state to the standby state, the third transistor is turned off after the eighth transistor has been turned off.

5. The MOS semiconductor integrated circuit device according to claim 1, wherein the first power supply node is a node which is supplied with a supply voltage of positive polarity and the second power supply node is a node which is supplied with ground potential.

6. The MOS semiconductor integrated circuit device according to claim 1, wherein the output node of the last-stage buffer circuit is connected to an external terminal of the semiconductor integrated circuit device.

7. A MOS semiconductor integrated circuit device comprising:
a word line to which a plurality of memory cells is connected;
a drive circuit connected to the word line to drive it; and
a control circuit which is connected to the drive circuit and produces a plurality of control signals to control the operation of the drive circuit,
the drive circuit including:
a prebuffer circuit connected to receive a signal to drive the word line and including a first transistor of P-channel type and a second transistor of N-channel type each having a gate and a current path, the first and second transistors being connected at their gates to receive the signal, one ends of the current paths of the first and second transistors being connected together to the output node of the prebuffer circuit, and the other end of the current path of the first transistor being connected to a first power supply node;
a third transistor of N-channel type having a gate and a current path connected at its one end to the other end of the current path of the second transistor and at its other end to a second power supply node;
a fourth transistor of P-channel type having a gate and a current path connected at its one end to the output node of the prebuffer circuit;
a fifth transistor of N-channel type having a gate connected to receive the signal and a current path connected between the other end of the current path of the fourth transistor and one end of the current path of the third transistor;
a last-stage buffer circuit connected to the output node of the prebuffer circuit and including a sixth transistor of P-channel type having a gate and a current path one end of which is connected to the word line and a seventh transistor of N-channel type having a gate and a current path connected at its one end to the word line and at its other end connected to the second power supply node, the gate of the sixth transistor being connected to the output node of the prebuffer circuit and the gate of the seventh transistor being connected to the other end of the current path of the fourth transistor;
an eighth transistor of P-channel type having a gate and a current path connected between the other end of the current path of the sixth transistor and the first power supply node; and
a ninth transistor of P-channel type having a gate and a current path connected between the first power supply node and the output node of the prebuffer circuit, and
the control circuit producing the control signals which are applied to the gates of the third, fourth, eighth and ninth transistors, in a standby state, the third, fourth and eighth transistors are turned off and the ninth transistor is turned on and, in an active state, the third, fourth and eighth transistors are turned on and the ninth transistor is turned off.

8. The MOS semiconductor integrated circuit device according to claim 7, further comprising a tenth transistor of N-channel type having a gate and a current path connected between the output node of the last-stage buffer circuit and the second power supply node, and wherein the control circuit produces a control signal applied to the gate of the tenth transistor, in the standby state, the tenth transistor is turned on and, in the active state, it is turned off.

9. The MOS semiconductor integrated circuit device according to claim 7, wherein the control circuit produces the control signals, at the transition from the standby state to the active state, the third transistor is turned on after the eighth transistor has been turned on.

10. The MOS semiconductor integrated circuit device according to claim 7, wherein the control circuit produces the control signals, at the transition from the active state to the standby state, the third transistor is turned off after the eighth transistor has been turned off.

11. The MOS semiconductor integrated circuit device according to claim 7, wherein the first power supply node is a node which is supplied with a supply voltage of positive polarity and the second power supply node is a node which is supplied with ground potential.

12. A MOS semiconductor integrated circuit device comprising:
a semiconductor chip having a plurality of IP blocks;
a plurality of in-chip interconnections provided in the semiconductor chip to interconnect the IP blocks;
a plurality of interface circuits each provided in a corresponding one of the IP blocks and outputs signals in the corresponding IP block onto the in-chip interconnections; and
a control circuit which is connected to each of the interface circuits and produces a plurality of control signals to control the operation of each of the interface circuit,
each of the interface circuits including:
a prebuffer circuit connected to receive a signal to drive an in-chip interconnection and including a first transistor of P-channel type and a second transistor of N-channel type each having a gate and a current path, the first and second transistors being connected at their gates to receive the signal, one ends of the current paths of the first and second transistors being connected together to the output node of the prebuffer circuit, and the other end of the current path of the first transistor being connected to a first power supply node;

a third transistor of N-channel type having a gate and a current path connected at its one end to the other end of the current path of the second transistor and at its other end to a second power supply node;

a fourth transistor of P-channel type having a gate and a current path connected at its one end to the output node of the prebuffer circuit;

a fifth transistor of N-channel type having a gate connected to receive the signal and a current path connected between the other end of the current path of the fourth transistor and one end of the current path of the third transistor;

a last-stage buffer circuit connected to the output node of the prebuffer circuit and including a sixth transistor of P-channel type having a gate and a current path one end of which is connected to the in-chip interconnection and a seventh transistor of N-channel type having a gate and a current path connected at its one end to the in-chip interconnection and at its other end connected to the second power supply node, the gate of the sixth transistor being connected to the output node of the prebuffer circuit and the gate of the seventh transistor being connected to the other end of the current path of the fourth transistor;

an eighth transistor of P-channel type having a gate and a current path connected between the other end of the current path of the sixth transistor and the first power supply node; and a ninth transistor of P-channel type having a gate and a current path connected between the first power supply node and the output node of the prebuffer circuit, and the control circuit producing the control signals which are applied to the gates of the third, fourth, eighth and ninth transistors, in a standby state, the third, fourth and eighth transistors are turned off and the ninth transistor is turned on and, in an active state, the third, fourth and eighth transistors are turned on and the ninth transistor is turned off.

13. The MOS semiconductor integrated circuit device according to claim 12, further comprising a tenth transistor of N-channel type having a gate and a current path connected between the output node of the last-stage buffer circuit and the second power supply node, and wherein the control circuit produces a control signal applied to the gate of the tenth transistor, in the standby state, the tenth transistor is turned on and, in the active state, it is turned off.

14. The MOS semiconductor integrated circuit device according to claim 12, wherein the control circuit produces the control signals, at the transition from the standby state to the active state, the third transistor is turned on after the eighth transistor has been turned on.

15. The MOS semiconductor integrated circuit device according to claim 12, wherein the control circuit produces the control signals, at the transition from the active state to the standby state, the third transistor is turned off after the eighth transistor has been turned off.

16. The MOS semiconductor integrated circuit device according to claim 12, wherein the first power supply node is a node which is supplied with a supply voltage of positive polarity and the second power supply node is a node which is supplied with ground potential.

* * * * *